Figure 1:
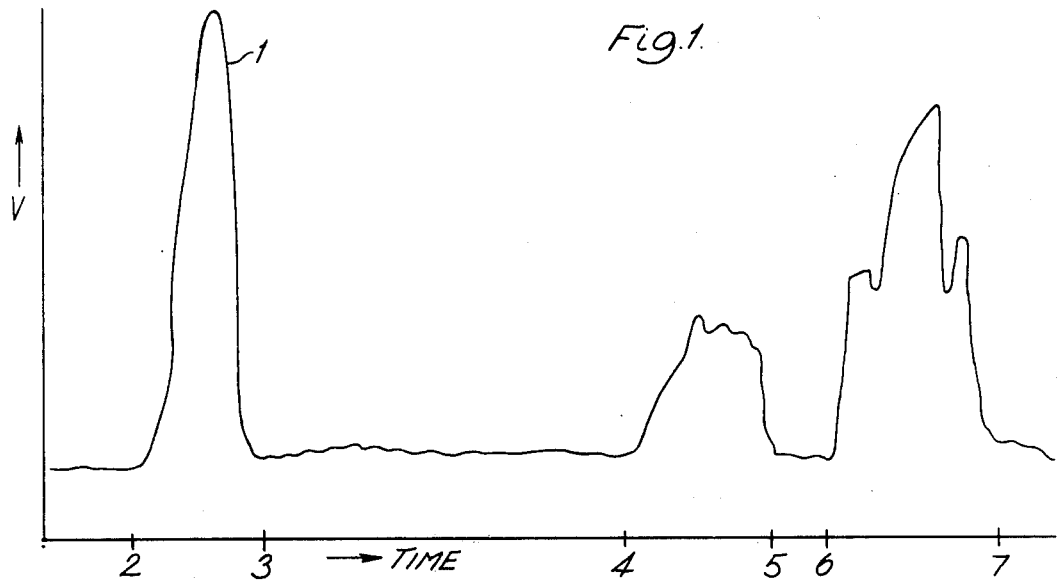

United States Patent [19]
Bunting

[11] 4,074,190
[45] Feb. 14, 1978

[54] SIGNAL MEASURING APPARATUS

[75] Inventor: Walter Bunting, Little Chalfont, England

[73] Assignee: National Research Development Corporation, London, England

[21] Appl. No.: 655,376

[22] Filed: Feb. 5, 1976

[51] Int. Cl.² .......................................... G01R 23/16
[52] U.S. Cl. .................................. 324/77 A; 324/185
[58] Field of Search .................. 324/77 A, 77 G, 185; 340/347 AD, 347 CC; 328/129, 130, 181, 183, 184, 185; 307/228, 235 N, 235 P

[56] References Cited
U.S. PATENT DOCUMENTS

| 3,122,729 | 2/1964 | Bothwell et al. | 324/99 D |
| 3,445,839 | 5/1969 | Engelberg et al. | 340/347 CC |
| 3,496,562 | 2/1970 | Smith | 307/235 N |
| 3,745,556 | 7/1973 | Dorey | 324/99 D |
| 3,786,358 | 1/1974 | Fiorino | 307/235 N |
| 3,975,684 | 8/1976 | Mordan | 324/185 |

Primary Examiner—M. Tokar
Attorney, Agent, or Firm—Cushman, Darby & Cushman

[57] ABSTRACT

Apparatus for measuring the time integral of a signal between pairs of time points comprises a ramp voltage generator and a plurality of pairs of potentiometers. A comparator circuit is associated with each potentiometer to provide a switching signal at the time point when the ramp voltage becomes equal to the potentiometer voltage. The switching signals are applied to a gate which is held open between each pair of time points to allow the signal to be measured to be passed to a suitable measuring means. Such measuring means may comprise a voltage-to-frequency converter and a counter so that the output of the counter represents the time integral of the signal.

3 Claims, 2 Drawing Figures

SIGNAL MEASURING APPARATUS

This invention relates to signal measuring apparatus. It has particular application where it is desired to measure a time varying signal and especially the time integral of the signal between selected pairs of points. Applications of the invention are inter alia in NMR spectroscopy, gas chromatography, calorimetric detection.

According to the invention signal measuring apparatus comprises a ramp voltage generator, a plurality of pairs of generators of dc voltages of adjustable magnitudes, a comparator circuit associated with each dc voltage generator for providing a switching signal when the output of the ramp generator is equal to the value of the voltage provided by its associated dc voltage generator, gating means for gating a signal to be measured to a measuring means when a switching signal is provided from one of the dc voltage generators of a pair and for blocking such signal when a switching signal is provided from the other dc voltage generator of a pair.

In carrying out the invention the dc voltage generators may conveniently comprise potentiometers.

In an embodiment of the invention the measuring means comprises a voltage-to-frequency converter and a counter whereby the output of the counter for the time in which the gating means is open represents the time integral of the signal in that time.

Figure 2:
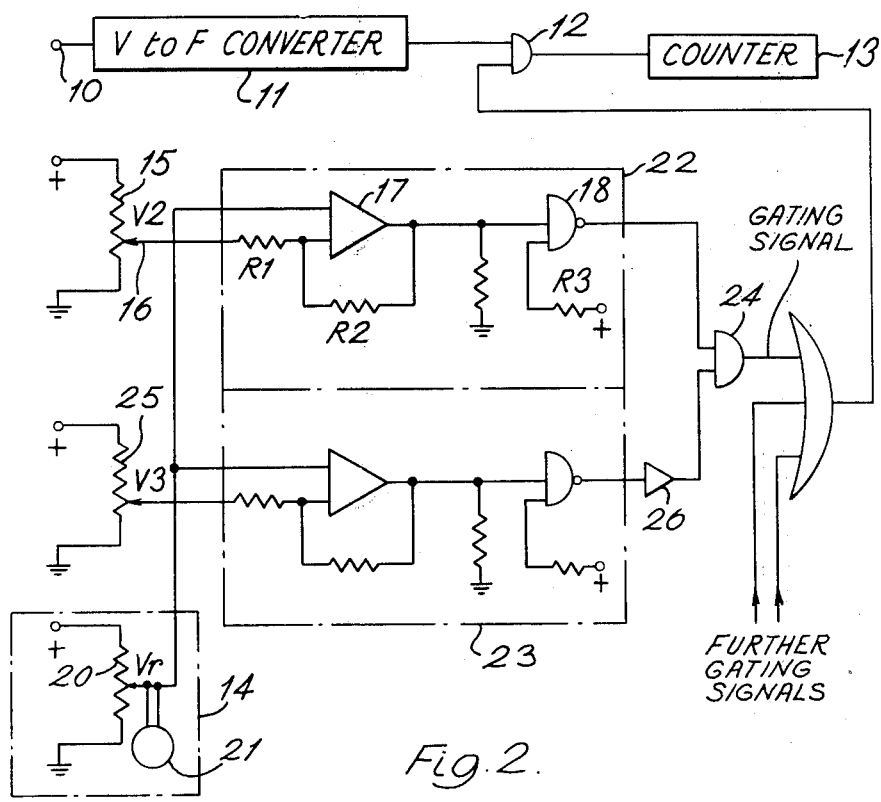

In order that the invention may be more fully understood reference will now be made to the drawing accompanying this specification in which:

FIG. 1 illustrates diagrammatically a time varying signal which it is desired to measure by apparatus according to the invention, and FIG. 2 illustrates in block diagrammatic form apparatus embodying the invention.

Referring now to FIG. 1 there is shown therein a time varying signal 1 which it is desired to measure. The signal may be a voltage signal or else can be converted to a voltage signal. Typical signals of this nature arise in NMR spectroscopy, gas chromatography, and in calorimetric detection. In these measurements the parameters of the signal that are of interest are the areas under the curve between selected pairs of points. Thus for example for the waveform 1 it may be that it is only the area under the curve between points 2 and 3, between points 4 and 5 and between points 6 and 7 that are of interest. The time integrated value of the waveform between these pairs of points can be measured by capacitive means but the use of capacitors is prone to error due to leakage and the like.

FIG. 2 shows apparatus for measuring the appropriate parts of the waveform 1. The waveform to be measured is fed in at terminal 10 to a voltage-to-frequency converter 11 which produces a pulse train the pulse rate of which is at any instant proportional to the magnitude of the signal input at that instant. The pulse train from converter 11 is fed through an AND gate 12 to a counter 13. It will thus be seen that the sum indicated in counter 13 is the integral of the waveform fed to terminal 10 for the duration in which gate 12 is open.

Gate 12 is arranged to be held open for the time between points 2 and 3 and again between points 4 and 5, and yet again between points 6 and 7. To achieve this a ramp voltage generator 14 is provided to generate a linearly rising voltage Vr which commences at the same time as waveform 1. Ramp voltage generator 14 may comprise a potentiometer 20 the slider of which is driven by a constant-speed motor 21. Since the drive for a conventional pen recorder operates in this fashion it is convenient for potentiometer 20 to be a linear potentiometer and the slider can be driven by a pen recorder drive mechanism.

Associated with point 2 in FIG. 1 a dc voltage generator is provided in the form of a potentiometer 15 the slider 16 of which is pre-set to provide a steady voltage V2 to which the ramp voltage Vr becomes equal at the instant of occurrence of point 2. The two signals Vr and V2 are fed to the inverting input and the noninverting input of an operational amplifier 17 the latter signal being fed through an input resistor R1. Amplifier 17 has a feedback resistor R2 connected to its noninverting input. The output from amplifier 17 is connected to a two-input NAND gate 18 the other input of which is connected through a resistor R3 to a positive supply line.

Amplifier 17 and NAND gate 18 and their associated components together comprise a comparator circuit 22 in which the voltages Vr and V2 are compared. When Vr is less than V2 the output from amplifier 17 is at a high level and this level may be termed a logical "1". The input to NAND gate 18 from resistor R3 is always at a high level (i.e. at level "1") accordingly both inputs to NAND gate 18 will be "1s" and thus the output from NAND gate 18 will be "0". When Vr reaches the level of V2 the output of amplifier 17 will drop to its "0" level. The inputs to NAND gate 18 will thus be "0" and "1" respectively and thus the output from NAND gate 18 will be "1". A similar comparator circuit 23 to comparator circuit 22 is associated with point 3 and with a potentiometer 25 which provides a dc voltage V3. The output of comparator 23 changes from 0 to 1 when Vr rises to V3.

To open and close AND gate 12 the outputs from comparator circuits 22 and 23 are taken together through an AND gate 24. The output from comparator 22 is fed directly as an input to AND gate 24 but the output from comparator 23 passes through an invertor 26 before being applied to AND gate 24. It will thus be seen that when ramp voltage Vr is less than both of the voltages V2 and V3 the inputs to AND gate 24 will be "0", and "1" respectively. Hence the output from AND gate 24 will be "0". When voltage Vr rises to reach voltage V2 both inputs to AND gate 24 become "1s" and hence its output is also a "1". On further rise of ramp voltage Vr to above the voltage V3 the output from comparator 23 becomes "1" and hence due to the presence of invertor 26 the output from AND gate 24 switches to "0". Accordingly it will be seen that AND gate 24 provides a "1" as a gating signal only for the period between points 2 and 3 and at all other times the output is an "0".

In addition to potentiometers 15 and 25 and their associated comparator circuits 22 and 23 further pairs of potentiometers and associated comparator circuits are also provided. The further potentiometers are set to provide voltages V4, V5, V6 and V7 corresponding to the points 4, 5, 6 and 7 in FIG. 1. Each pair of comparator circuits is connected to a further AND gate similar to AND gate 24 and in the case of the second comparator circuit of a pair an inverter similar to inverter 26 is interposed. It will thus be seen that a series of gating signals is available, these gating signals subsisting between the successive pairs of points 2, 3 and 4, 5 and 6,7. As shown in FIG. 2 there is only a single counter 13 to which the output from the voltage-to-frequency converter 11 is applied. If such an arrangement is used all the gating signals are fed to an exclusive OR gate 27 the output of which is applied to AND gate 12. Counter 13 thus displays the total count for all the areas of interest in the curve of FIG. 1.

If on the other hand it is desired to indicate the count from each area separately then individual AND gates and counters similar to AND gate 12 and counter 13 are connected to the output from converter 11 and each AND gate (such as 12) is controlled from an AND gate (such as 24) which provides the gating signal. In these circumstances OR gate 27 is dispensed with.

The output of counter 13 can be processed in a digital processor to give a print-out of the counts for each area of interest. A number of scans of the signal being measured can be executed and the processor is programmed to give the average of the counts obtained. The program can also provide control of drive motor 21 to execute a number of scans in synchronism with the generation of signal 1.

I claim:

1. Signal measuring apparatus for measuring selected pairs of a time varying signal comprising measuring means for measuring the integral with respect to time of parts of a time varying signal gated to said measuring means, a ramp voltage generator, a plurality of pairs of generators of dc voltages of adjustable magnitudes, a comparator circuit associated with each dc voltage generator for providing a switching signal when the output of the ramp generator is equal to the value of the voltage provided by its associated dc voltage generator, gating means for gating a signal to be measured to said measuring means when a switching signal is provided from one of the dc voltage generators to a pair and for blocking such signal when a switching signal is provided from the other dc voltage generator of a pair.

2. The apparatus as claimed in claim 1 in which the dc voltage generators comprise potentiometers.

3. The apparatus as claimed in claim 1 in which the measuring means comprises a voltage-to-frequency converter and a counter whereby the output of the counter for the time in which the gating means is open represents the time integral of the signal in that time.

* * * * *